United States Patent [19]
Kushihi et al.

[11] Patent Number: 6,040,806
[45] Date of Patent: Mar. 21, 2000

[54] CIRCULAR-POLARIZATION ANTENNA

[75] Inventors: Yuichi Kushihi; Masaru Shikata, both of Kanazawa, Japan

[73] Assignee: Murata Manufacturing Co., Ltd., Japan

[21] Appl. No.: 09/060,697

[22] Filed: Apr. 15, 1998

[30] Foreign Application Priority Data

| Apr. 18, 1997 | [JP] | Japan | 9-101658 |
| Dec. 19, 1997 | [JP] | Japan | 9-350444 |
| Feb. 27, 1998 | [JP] | Japan | 10-047332 |

[51] Int. Cl.[7] .................................. H01Q 1/24
[52] U.S. Cl. .................. 343/853; 343/702; 343/700 MS
[58] Field of Search .................................. 343/853, 700, 343/702, 895, 873, 846

[56] References Cited

U.S. PATENT DOCUMENTS 5,377,081  12/1994  Bizen et al. ............................ 361/818

FOREIGN PATENT DOCUMENTS

| 0346125 | 12/1989 | European Pat. Off. |
| 0746054 | 12/1996 | European Pat. Off. |
| 0766340 | 4/1997  | European Pat. Off. |
| 0767511 | 4/1997  | European Pat. Off. |
| 2238665 | 6/1991  | United Kingdom . |
| 2297650 | 8/1996  | United Kingdom . |

*Primary Examiner*—Don Wong
*Assistant Examiner*—James Clinger
*Attorney, Agent, or Firm*—Ostrolenk, Faber, Gerb & Soffen, LLP

[57] ABSTRACT

The invention provides a low-profile circular-polarization antenna that can be implemented at a reduced mounting cost of components. Two linear-polarization surface-mount antennas are mounted on a mounting substrate such that their planes of polarization are perpendicular to each other in the direction normal to the mounting surface, and an amplification circuit, a shield case for covering the circuit, and a phase circuit for sending signals having the same amplitude and a phase difference of 90 degrees to the two surface-mount antennas are provided on the same mounting surface.

32 Claims, 11 Drawing Sheets

CIRCULAR-POLARIZATION ANTENNA

BACKGROUND OF THE INVENTION

1. Field of the Invention

The present invention relates to circular-polarization antennas, and more particularly, to a compact low-profile circular-polarization antenna such as a GPS antenna used for car-mounted and portable navigation systems. The present invention further relates to a radio apparatus using the circular-polarization antenna.

2. Related Art of the Invention

FIG. 17 shows a conventional circular-polarization antenna. The circular-polarization antenna is of a microstrip patch type.

In FIG. 17, the circular-polarization antenna 100 includes a mounting substrate 101, a patch antenna 102 mounted on the second major surface of the mounting substrate 101, a shield case 103 for covering an amplification circuit (not shown) mounted on the first major surface of the mounting substrate 101, and a cable 104 connected to the amplification circuit at one end. The patch antenna 102 is made from a dielectric substrate such as ceramic and resin. A ground electrode is formed on the whole first major surface of the patch antenna 102 and a substantially square emission electrode 102a is formed on the second major surface. About between the center of the emission electrode 102a and one corner, a through hole 102b passing through the dielectric substrate and the mounting substrate 101 and being connected to the amplification circuit mounted on the first major surface of the mounting substrate 101 is formed.

FIGS. 18(a) and 18(b) show another conventional circular-polarization antenna. It is also of a microstrip patch type. The same symbols as those used in FIG. 17 are assigned to the patch antenna. FIG. 18(a) is a perspective view of the circular-polarization antenna when viewed from the second major surface of a mounting substrate and FIG. 18(b) is a perspective view of the circular-polarization antenna when viewed from the first major surface of the mounting substrate.

In FIG. 18, the circular-polarization antenna 110 includes a mounting substrate 111, a patch antenna 102 mounted on the second major surface of the mounting substrate 111, a shield case 112 for covering an amplification circuit mounted on the second major surface of the mounting substrate 111, a connection electrode 113 for connecting the patch antenna 102 to the amplification circuit through the first major surface of the mounting substrate 111, a shield case 114 for covering the connection electrode 113 at the first major surface of the mounting substrate 111, and a cable 115 connected to the amplification circuit at one end.

Since the patch antenna 102 has a microstrip structure, a ground electrode is formed substantially on the whole mounting surface thereof. To connect the patch antenna 102 to the amplification circuit, it is necessary to route through the first major surface of the mounting substrate 111. The shield case 114 is provided in order to protect the connection electrode 113 and to suppress unwanted emission.

In the conventional circular-polarization antenna 100 shown in FIG. 17, since the ground electrode is formed on the whole mounting surface of the dielectric substrate constituting the patch antenna 102, it is necessary to provide the amplification circuit and the shield case 103 at the first major surface of the mounting substrate 101. Therefore, the circular-polarization antenna has a high profile as a whole. In addition, since components are required to be mounted on both surfaces of the mounting substrate 101, mounting cost is high.

On the other hand, in the conventional circular-polarization antenna 110 shown in FIG. 18, the amplification circuit and the shield case 112 are mounted on the same plane of the mounting substrate 111 as the patch antenna 102. Also in this case, to form the connection electrode 113 for connecting the amplification circuit to the patch antenna 102 on the first major surface of the mounting substrate 111, it is required to provide the shield case 114 for covering the connection electrode 113 on the first major surface of the mounting substrate 111. Therefore, it is difficult to reduce the height of the circular-polarization antenna as a whole and mounting cost is unlikely to be reduced.

In the conventional case shown in FIG. 18, a multilayer substrate may be used for the mounting substrate and the connection electrode could be formed on an inner layer of the mounting substrate. In this case, however, the mounting substrate costs increase even further.

SUMMERY OF THE INVENTION

Accordingly, it is an object of the present invention to provide a low-cost, low-profile circular-polarization antenna and a radio apparatus having a low mounting cost.

The present invention provides a circular-polarization antenna, comprising: a mounting substrate; a pair of linear-polarization surface-mount antennas mounted on said mounting substrate disposed such that their planes of polarization in the direction normal to the mounting surface of said mounting substrate are substantially perpendicular to each other; a phase circuit connected to said pair of linear-polarization surface-mount antennas for sending thereto or receiving therefrom signals having the same amplitude and a phase difference of 90 degrees to each other; an amplification circuit connected to said phase circuit; a shield case covering said amplification circuit; and said pair of linear-polarization surface-mount antennas, said phase circuit, said amplification circuit and said shield case being mounted on the same mounting surface of said mounting substrate.

According to the above described circular-polarization antenna, a low profile antenna is implemented and the mounting cost of components is reduced.

The above circular-polarization antenna may further comprise a radome covering said surface-mount antennas, said phase circuit, said shield case and said mounting substrate.

In the above circular-polarization antenna, each of the surface-mount antennas may have at least a power-feeding electrode, an emission electrode, and a ground electrode provided on the surface or both on the surface and in the inside of a substantially parallelopiped-rectangular base member made of at least one of a dielectric material and a magnetic material.

In the above circular-polarization antenna, each of said surface-mount antennas may be formed such that said ground electrode is provided substantially on a first major surface of said base member, said emission electrode may be formed substantially on a second major surface of the base member with one end serving as an open end and the other end serving as a ground end connected to said ground electrode, and one end of said power-feeding electrode may be formed in the vicinity of the open end of said emission electrode.

In the above circular-polarization antenna, the other end of said emission electrode of each of the surface-mount antennas may be divided into a plurality of ends, and the ends are connected to the ground electrode through different end faces of said base member and serve as ground ends.

In the above circular-polarization antenna, said pair of surface-mount antennas may be disposed such that their ground ends are farthest away from each other.

In the above circular-polarization antenna, the open end of said emission electrode in each of said surface-mount antennas may be formed inward from the end of the second major surface of said base member at a predetermined distance on the second major surface of the base member.

The above described circular-polarization antenna may further comprise a shield plate provided between said pair of surface-mount antennas.

By disposing the two surface-mount antennas such that the distance between the ground ends of the emission electrodes are longest, by forming the open ends of the emission electrodes in the two surface-mount antennas so as to be away from the ends of the second major surfaces of the base members by a certain distance, or by providing a shield plate between the two surface-mount antennas at a portion where the antennas are close to each other, the mutual interference between the two surface-mount antennas is reduced and a low-profile circular-polarization antenna is made with a low-profile radome.

In the above circular-polarization antenna, said phase circuit may comprise at least one of a capacitive element and an inductive element connected to said pair of surface-mount antennas.

The present invention further provides a radio apparatus, comprising: the above described circular-polarization antenna; a receiving section and a signal-processing section connected in series to said circular-polarization antenna.

The present invention further provides a use of the above described circular-polarization antenna for a radio apparatus.

According to the radio apparatus of the present invention, miniaturization, cost reduction and lowering cost of set up the radio apparatus itself can be achieved by using the circular-polarization antenna of the present invention.

BRIEF DESCRIPTION OF THE DRAWINGS

FIG. 18(*a*) is a view seen from the second major surface of a mounting substrate, and FIG. 18(*b*) is a view seen from the first major surface.

Other features and advantages of the present invention will become apparent from the following description of the invention which refers to the accompanying drawings.

PREFERRED EMBODIMENTS OF THE PRESENT INVENTION

Figure 1:
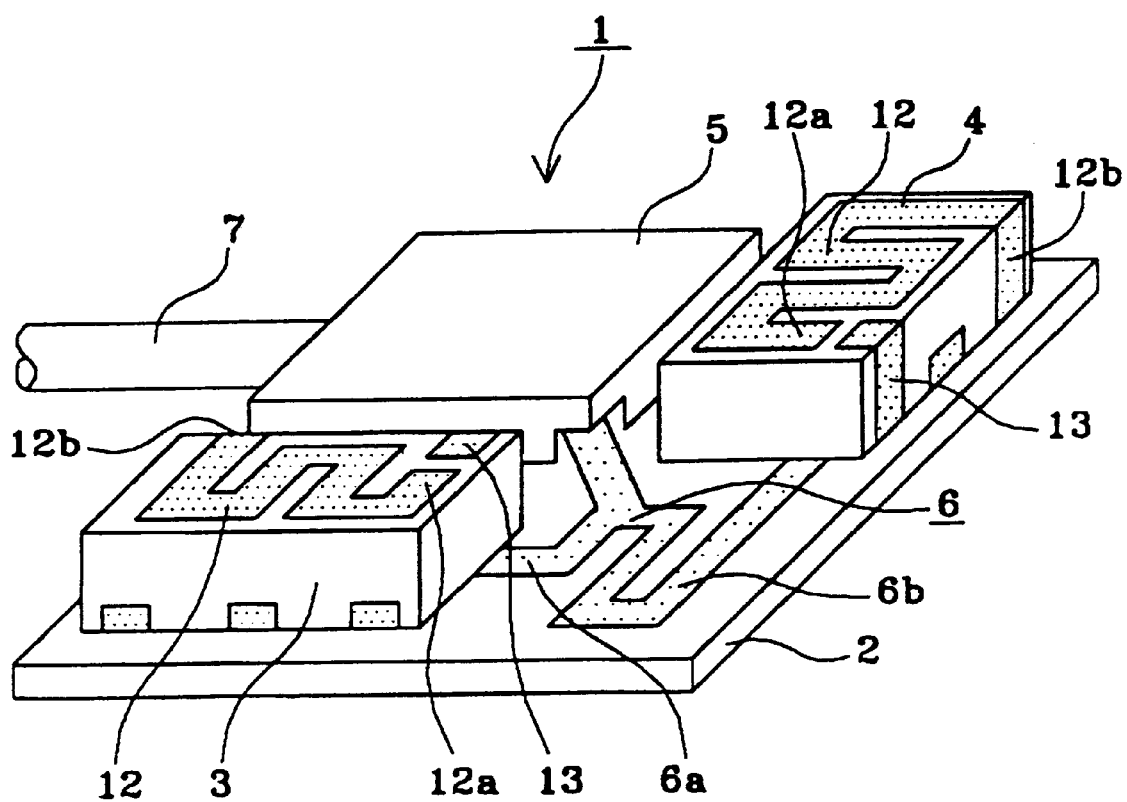
FIG. 1 is a perspective view of a circular-polarization antenna according to an embodiment of the present invention.

FIG. 1 is a circular-polarization antenna according to an embodiment of the present invention. In FIG. 1, the circular-polarization antenna 1 includes a mounting substrate 2, surface-mount antennas 3 and 4 mounted on the second major surface of the mounting substrate 2, a shield case 5 for covering an amplification circuit (not shown) mounted on the second major surface of the mounting substrate 2, a phase circuit 6 for connecting the amplification circuit to the surface-mount antennas 3 and 4, and a cable 7 connected to the amplification circuit at one end. There is nothing mounted on the first major surface of the mounting substrate 2. The surface-mount antennas 3 and 4 have the same structure and, as described later, are disposed such that their longitudinal directions are perpendicular to each other in order that their planes of polarization are perpendicular to each other in the direction normal to the mounting surface of the mounting substrate 2. The phase circuit 6 is formed of a microstrip line and one end thereof is divided to a microstrip line 6*a* and a microstrip line 6*b*, which are connected to the surface-mount antennas 3 and 4, respectively. The microstrip lines 6*a* and 6*b* are capacitive and inductive, and function as a capacitive element and an inductive element. The lengths and the widths of the microstrip lines 6*a* and 6*b* are determined such that the absolute values of the impedances thereof match those of the output impedances of the surface-mount antennas 3 and 4. Specifically, the microstrip line 6*b* is set longer than the microstrip line 6*a*.

Figure 2:
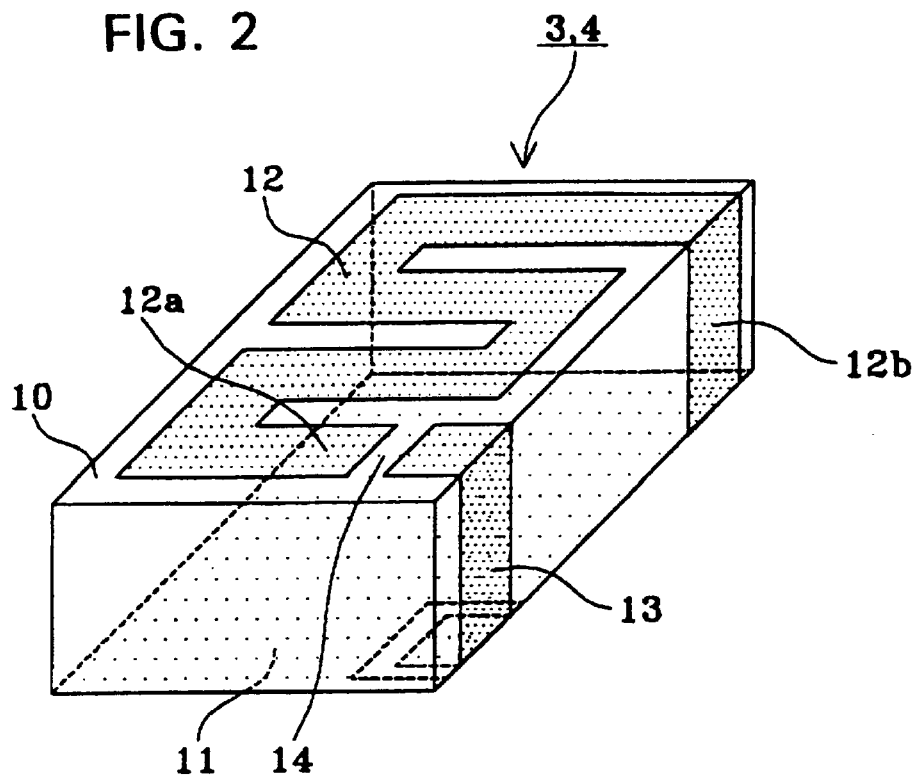
FIG. 2 is a full perspective view showing the structure of a surface-mount antenna used in the embodiment shown in FIG. 1.

FIG. 2 shows the structure of the surface-mount antennas 3 and 4 used in the embodiment shown in FIG. 1. In FIG. 2, the surface-mount antenna 3 or 4 includes a base member 10 made from a dielectric such as resin or ceramic, a ground electrode 11 formed on the first major surface of the base member 10, a meander-shaped emission electrode 12 having a length about one-fourth the wavelength at the resonant frequency, formed on the second major surface of the base member 10, and a power-feeding electrode 13 extending from the first major surface of the base member 10 to the second major surface through one end face. One end of the emission electrode 12 serves as an open end 12a, which is disposed so as to oppose the power-feeding electrode 13 through a gap 14, and the other end serves as a ground end 12b, which is connected to the ground electrode 11 through one end face of the base member 10.

In the surface-mount antenna 3 or 4, which is configured as described above, when a signal is input to the power-feeding electrode 13, the signal is transferred from the power-feeding electrode 13 to the emission electrode 12 through the gap 14. Since the emission electrode 12 forms a λ/4 stub having a ground end and an open end, it resonates according to the input signal. Then, an electric field is generated between the emission electrode 12 and the ground electrode 11, and a part of the energy thereof leaks out and is emitted as a radio wave. The wave has linear polarization in which the direction of the electric field matches the longitudinal direction of the base member 10 and is emitted in directions substantially perpendicular to the longitudinal direction of the base member 10.

Referring back to FIG. 1, in the circular-polarization antenna 1 configured as described above, the two surface-mount antennas 3 and 4 are disposed such that the longitudinal directions of their base members are perpendicular to each other in order that their planes of polarization (planes formed by the direction of the electric field and the direction the wave proceeds) of the emitted waves are perpendicular to each other in the direction normal to the mounting substrate 2. On the other hand, signals transferred from the two surface-mount antennas 3 and 4 to the amplification circuit have a phase shift of 90 degrees caused by the phase circuit 6. As a result, the circular-polarization antenna 1 operates as an antenna handling circularly polarized waves.

With this structure of the circular-polarization antenna 1, since the shield case 5 covering the amplification circuit, the surface-mount antennas 3 and 4 and the phase circuit 6 are mounted on only the second major surface of the mounting substrate 2, the mounting cost for the components is reduced, and a low-profile antenna is implemented. In addition, when the phase circuit 6 is formed of a capacitive element and an inductive element such that the absolute values of their impedances match those of the output impedances of the surface-mount antennas 3 and 4, signals having the same amplitude and a phase difference of 90 degrees are sent to the surface-mount antennas 3 and 4, and matching is achieved from the amplification circuit to the surface-mount antennas 3 and 4.

Since the emission electrodes 12 of the two surface-mount antennas 3 and 4 are set to have lengths of about λ/4 in the circular-polarization antenna 1 shown in FIG. 1, high-frequency currents flowing through the emission electrodes 12 become highest at the ground ends 12b. The highest high-frequency currents indicate that generated magnetic fields also become strongest there. Since the ground ends 12b are formed perpendicular to major surfaces of the base members 10 on the end faces of the base members 10, namely perpendicular to the mounting substrate 2, in the two surface-mount antennas 3 and 4, the magnetic fields generated by the high-frequency currents flowing near the ground ends 12b are parallel to the mounting substrate 2. Therefore, if the ground ends 12b of the two surface-mount antennas 3 and 4, or the ground ends 12b and the power-feeding electrodes 13, which are formed on the same end faces of the base members 10 as the ground ends 12b, are closely disposed, they interfere with each other and the antenna characteristics, especially the axial ratio of circular polarization, deteriorate.

In the circular-polarization antenna 1, the two-surface antennas 3 and 4 are arranged such that the open ends 12a of the emission electrodes 12 are disposed close to each other in order that the ground ends 12b are farthest away from each other. With this positioning, the two surface-mount antennas 3 and 4 have reduced mutual interference and the deterioration of the antenna characteristics of the circular-polarization antenna 1 is prevented.

Figure 3:
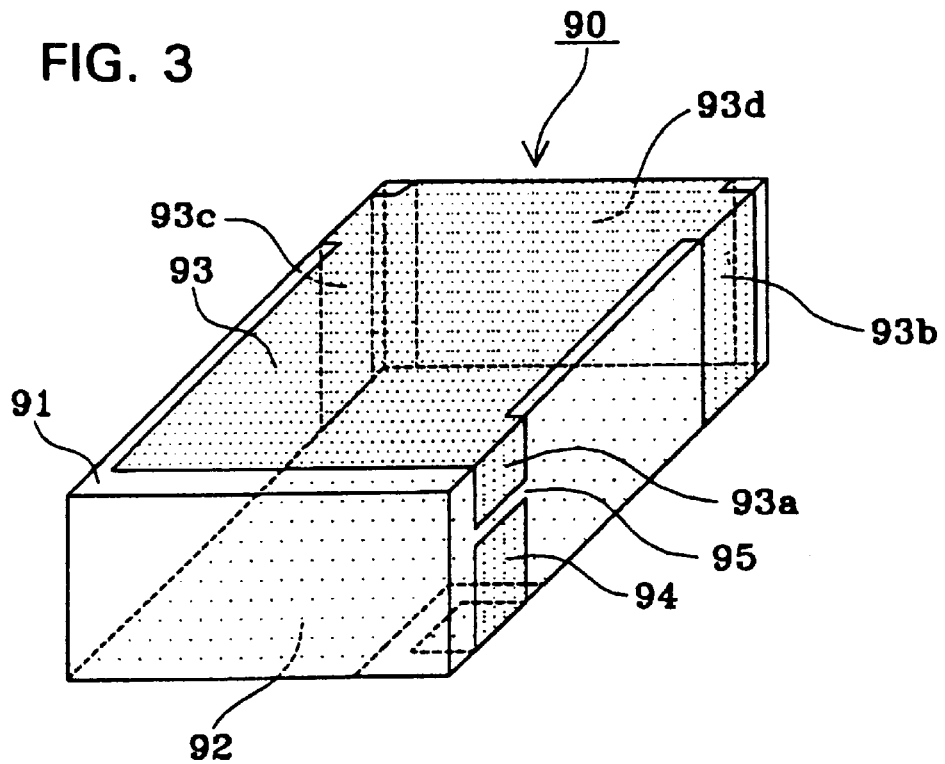
FIG. 3 is a full perspective view showing the structure of another surface-mount antenna used in a circular-polarization antenna according to the present invention.

FIG. 3 shows the structure of another surface-mount antenna used in a circular-polarization antenna according to the present invention. In FIG. 3, the surface-mount antenna 90 includes a base member 91 made from a dielectric such as resin or ceramic, a ground electrode 92 formed on the first major surface of the base member 91, an emission electrode 93 having a length on the second major surface of the base member 91 about one-fourth the wavelength at the resonant frequency, and a power-feeding electrode 94. One end of the emission electrode 93 extends to one end face and serves as an open end 93a, and the other end branches into three ground ends 93b, 93c, and 93d, which are connected to the ground electrode 92 through different end faces of the base member 91. The power-feeding electrode 94 is formed such that its one end opposes the open end 93a of the emission electrode 93 through a gap 95 on one end face of the base member 91, and the other end extends to the first major surface of the base member 91.

In the surface-mount antenna 90, which is configured as described above, when a signal is input to the power-feeding electrode 94, the signal is transferred from the power-feeding electrode 94 to the emission electrode 93 through the gap 95. Since the emission electrode 93 forms a λ/4 stub having an open end and a ground end, it resonates according to the input signal. Then, an electric field is generated between the emission electrode 93 and the ground electrode 92, and a part of the energy thereof leaks out and is emitted as a radio wave. The wave has linear polarization in which the direction of the electric field matches the longitudinal direction of the base member 91 and is emitted in directions substantially perpendicular to the longitudinal direction of the base member 91.

In the surface-mount antenna 90, one end of the emission electrode 93 branches into the three ground ends 93b, 93c, and 93d, which are connected to the ground electrode 92 through different end faces. This point will be described next.

Figure 4:
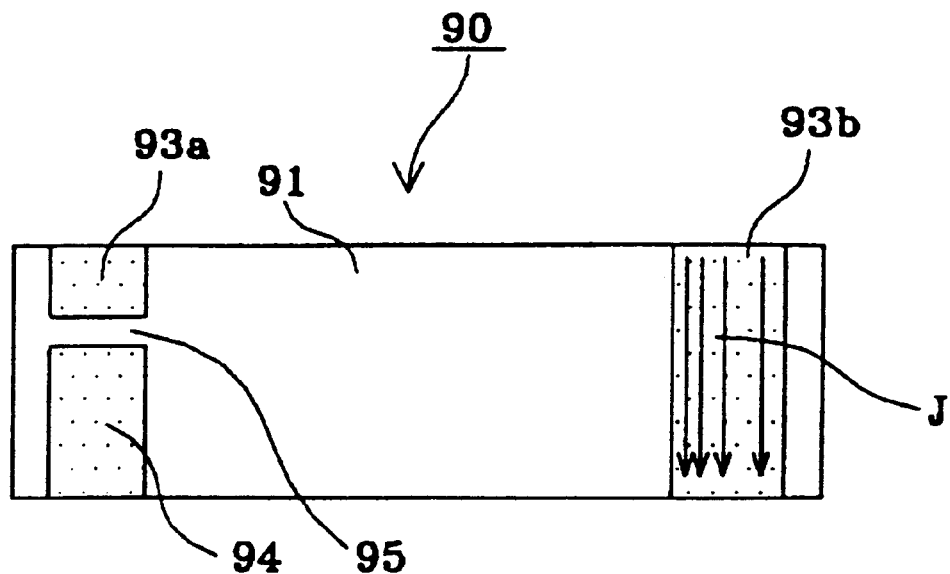
FIG. 4 is a side view showing currents flowing into a ground end in a case when the surface-mount antenna shown in FIG. 3 has only the ground end.

If the surface-mount antenna 90 has only the ground end 93b as the other end of the emission electrode 93 without having the ground ends 93c and 93d, all currents flowing into the other end of the emission electrode 93 gather at the ground end 93b. FIG. 4 shows the amount of the currents flowing into the ground end 93b when only the ground end 93b serves as the other end of the emission electrode 93. In FIG. 4, the same symbols as those used in FIG. 3 are assigned to the same portions or the equivalent portions. As shown in FIG. 4, currents J flowing through the ground end 93b gather at the portion close to the open end 93a in the ground end 93b due to their electromagnetic characteristics. Therefore, the current density at the ground end 93b becomes very large, and the antenna gain is reduced due to conductor loss at the end. To solve this problem, it can be considered that the width of the ground end 93b is extended. Also in this case, since the characteristics in which the flowing currents gather at the portion close to the open end 93a does not change, the substantial length of the emission electrode 93 is reduced because the open end 93a becomes close to the ground end 93b, and the resonant frequency becomes high. Just this drawback is produced. The conductor loss cannot be reduced.

When the ground end of the emission electrode 93 is divided into three ends 93b, 93c, and 93d, however, since the flowing currents disperse, the amount of currents flowing through each ground end is reduced. Since the current density at one ground end decreases, the conductor loss is reduced and the antenna gain is increased.

In the surface-mount antenna 90 shown in FIG. 3, the ground end is divided into three portions. When the antenna is configured such that the ground end 93d is omitted and the end is divided into only two ground ends 93b and 93c formed on two end faces opposing each other, for example, the same advantages may be obtained.

Figure 5:
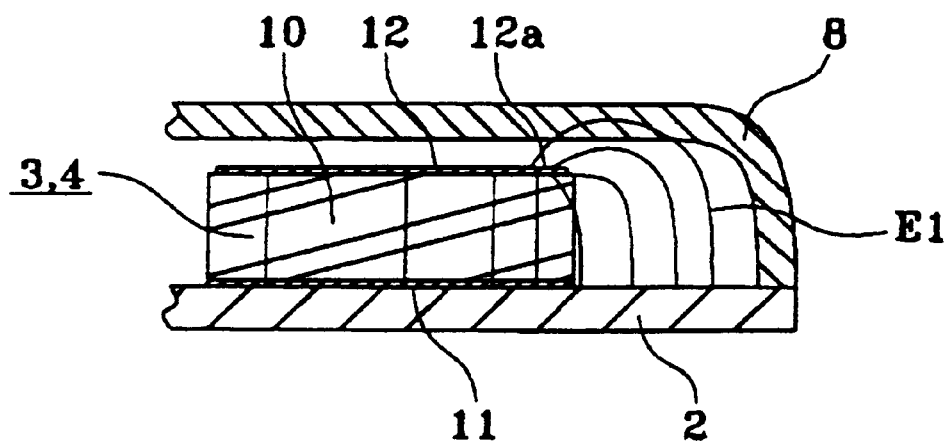
FIG. 5 is a cross section showing an electric field generated from the emission electrode of a surface-mount antenna constituting the linear-polarization antenna shown in FIG. 1.

With an antenna to be installed outdoors such as a GPS antenna among the circular-polarization antennas, the entire antenna is covered by a radome to protect the antenna element. FIG. 5 is a cross section illustrating an electric field emitted from the emission electrode 12 of a surface-mount antenna 3 or 4 in a case when the circular-polarization antenna 1 is covered by a radome. In FIG. 5, there is shown a radome 8.

As shown in FIG. 5, since the length of the emission electrode 12 in the surface-mount antenna 3 or 4 is set to about $\lambda/4$, an electric field E1 emitted from the emission electrode 12 of the surface-mount antenna 3 or 4 becomes strongest at the open end 12a of the emission electrode 12. Because the open end 12a is formed close to the end of the second major surface of the base member 10, and the radome 8, which is a dielectric having a certain dielectric constant, covers the surface-mount antenna 3 or 4 just over it to make a low-profile circular-polarization antenna, a part of the electric field E1, which essentially proceeds toward the ground electrode 11, emitted from the open end 12a is drawn by the radome 8 and reaches a portion away from the end of the base member 10.

A condition in which the electric fields E1 emitted from the emission electrodes 12 reach portions away from the ends of the surface-mount antennas 3 and 4 means that a possibility in which the two surface-mount antennas 3 and 4 interfere with each other by their electric fields E1 increases. This deteriorates the antenna characteristics.

Figure 6:
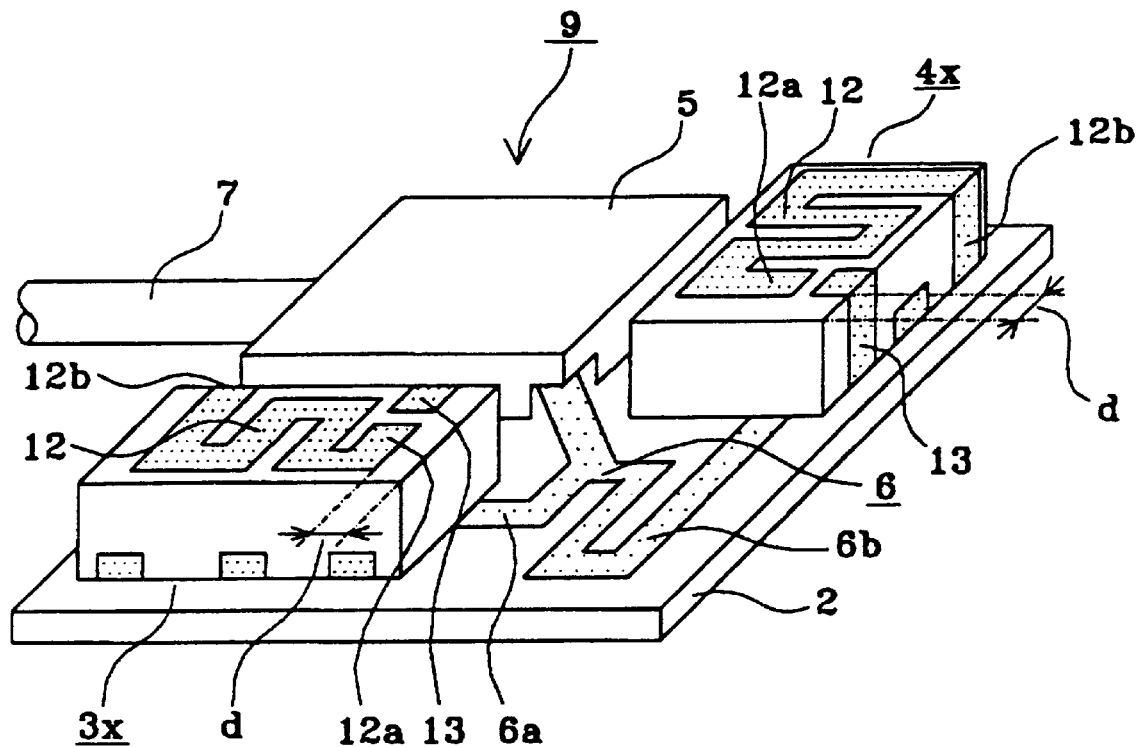
FIG. 6 is a perspective view of a circular-polarization antenna according to another embodiment of the present invention.

FIG. 6 shows another embodiment of the present invention. FIG. 6 illustrates a case in which deterioration of the antenna characteristics due to an electric field emitted from the open end of an emission electrode is prevented. The same symbols as those used in FIGS. 1 and 2 are assigned to the same portions or the equivalent portions in FIG. 6, and the descriptions thereof will be omitted.

In FIG. 6, the open ends 12a of the emission electrodes 12 of two surface-mount antennas 3x and 4x constituting a circular-polarization antenna 9 are formed at positions inward from the ends of the base members 10 at a certain distance "d."

Figure 7:
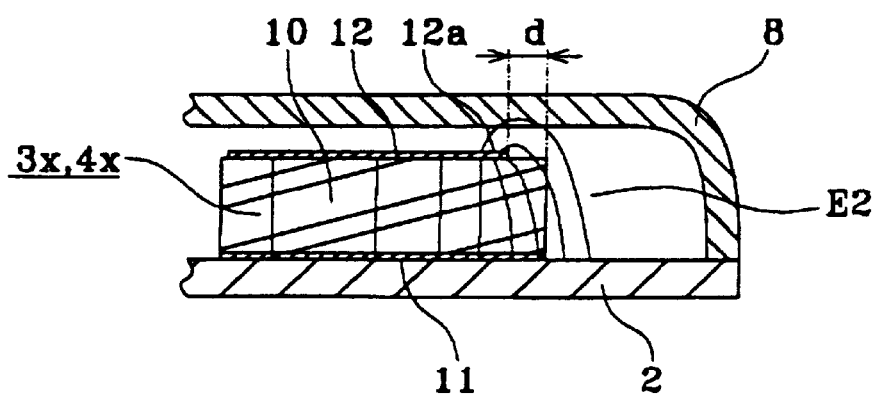
FIG. 7 is a cross section showing an electric field generated from the emission electrode of a surface-mount antenna constituting the linear-polarization antenna shown in FIG. 6.

FIG. 7 is a cross section illustrating an electric field emitted from the emission electrode 12 of the surface-mount antenna 3x or 4x in the circular-polarization antenna 9. Since the open end 12a of the emission electrode 12 in the surface-mount antenna 3x or 4x is formed at a position inward from the end of the second major surface of the base member 10 by a certain distance "d," most of an electric field E2 emitted from the open end 12a proceeds to the ground electrode 11 and a part of the electric field E2 drawn by the radome 8 does not reach far from the end of the base member 10. As a result, the mutual interference between the two surface-mount antennas 3 and 4 is reduced, and deterioration of the antenna characteristics of the circular-polarization antenna 9 is prevented. In addition, since the antenna characteristics of the circular-polarization antenna 9 is unlikely to be affected by the radome 8, the height of the radome 8 can be further reduced and a low-profile circular-polarization antenna can be made.

Figure 8:
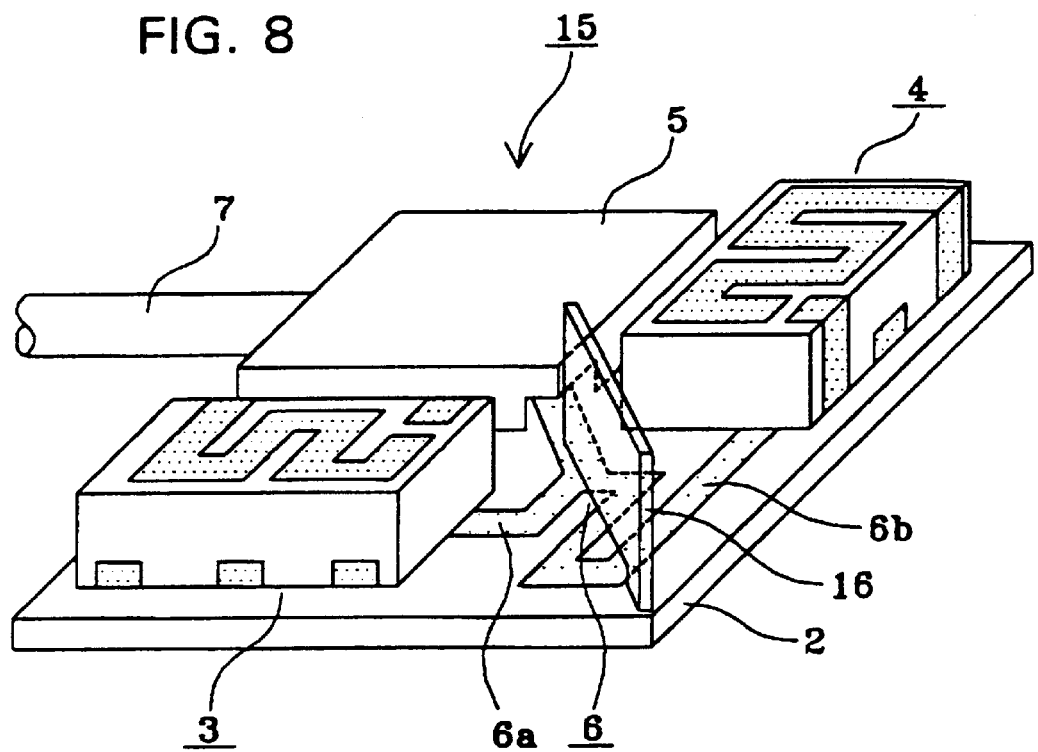
FIG. 8 is a perspective view of a circular-polarization antenna according to still another embodiment of the present invention.

FIG. 8 shows still another embodiment of the present invention. FIG. 8 illustrates a case in which the mutual interference of two surface-mount antennas is prevented. The same symbols as those used in FIG. 1 are assigned to the same portions or the equivalent portions in FIG. 8, and the descriptions thereof will be omitted.

In FIG. 8, a shield plate 16 insulating from a phase circuit 6 is provided above the phase circuit 6 between two surface-mount antennas 3 and 4 disposed on a mounting substrate 2 in a circular-polarization antenna 15 at a portion where the antennas are disposed close. The shield plate 16 is made from a conductor such as a metal, and its end is insulated from the mounting substrate 2 and secured, and is also grounded. Since the shield plate 16 is provided between the two surface-mount antennas 3 and 4 at a portion where the antennas are disposed close, a magnetic field and an electric field emitted from portions close to each other of the two surface-mount antennas are shielded. With this, the mutual interference between the two surface-mount antennas 3 and 4 is prevented, and deterioration of the antenna characteristics of the circular-polarization antenna 15 is prevented. In the same way as for the circular-polarization antenna 9 shown in FIG. 6, since the mutual interference between the two surface-mount antennas does not increase even if a radome is provided, the height of the radome can be reduced and a low-profile circular-polarization antenna 15 can be made.

Figure 9:
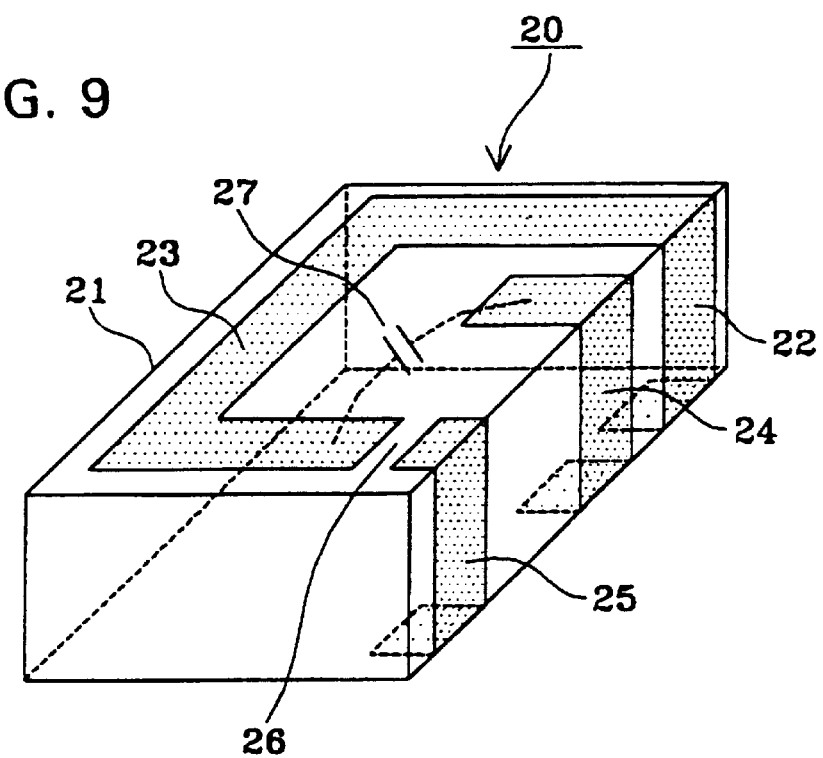
FIG. 9 is a full perspective view showing the structure of still another surface-mount antenna used in a circular-polarization antenna according to the present invention.

FIG. 9 shows the structure of still another surface-mount antenna used for a circular-polarization antenna according to the present invention. In FIG. 9, the surface-mount antenna 20 includes a base member 21 made from a dielectric such as resin or ceramic, a ground electrode 22 formed from one end face of the base member 21 to the first major surface, an emission electrode 23 formed in a U shape with two right angles at the bottom on the second major surface of the base member 21, a power-feeding electrode 24 extending from the first major surface of the base member 21 to the second major surface through one end face, and a ground electrode 25 formed from the first major surface of the electrode 21 to the second major surface through one end face. One end of the emission electrode 23 is connected to the ground electrode 22, and the other end serves as an open end. One end of the ground electrode 25 is disposed such that it opposes the open end of the emission electrode 23 through a gap 26. Corresponding to the open end of the emission electrode 23, the power-feeding electrode 24 is disposed close to the ground electrode 22 at the open-end side of the emission electrode 23.

In the surface-mount antenna 20 configured as described above, when a signal is input to the power-feeding electrode 24, the signal is transferred from the power-feeding electrode 24 to the emission electrode 23 through a capacitor 27 formed between the power-feeding electrode 24 and the open end of the emission electrode 23. One end of the emission electrode 23 is connected to the ground electrode 22, and the other end serves as an open end. By the capacitance between the open end and the ground electrode 25, and the inductance of the emission electrode itself, the emission electrode 23 operates as an LC resonant circuit. An electric field is generated between the emission electrode 23 and the ground electrode 25, a part of the energy thereof leaks out, and it is emitted as a radio wave.

Figure 10:
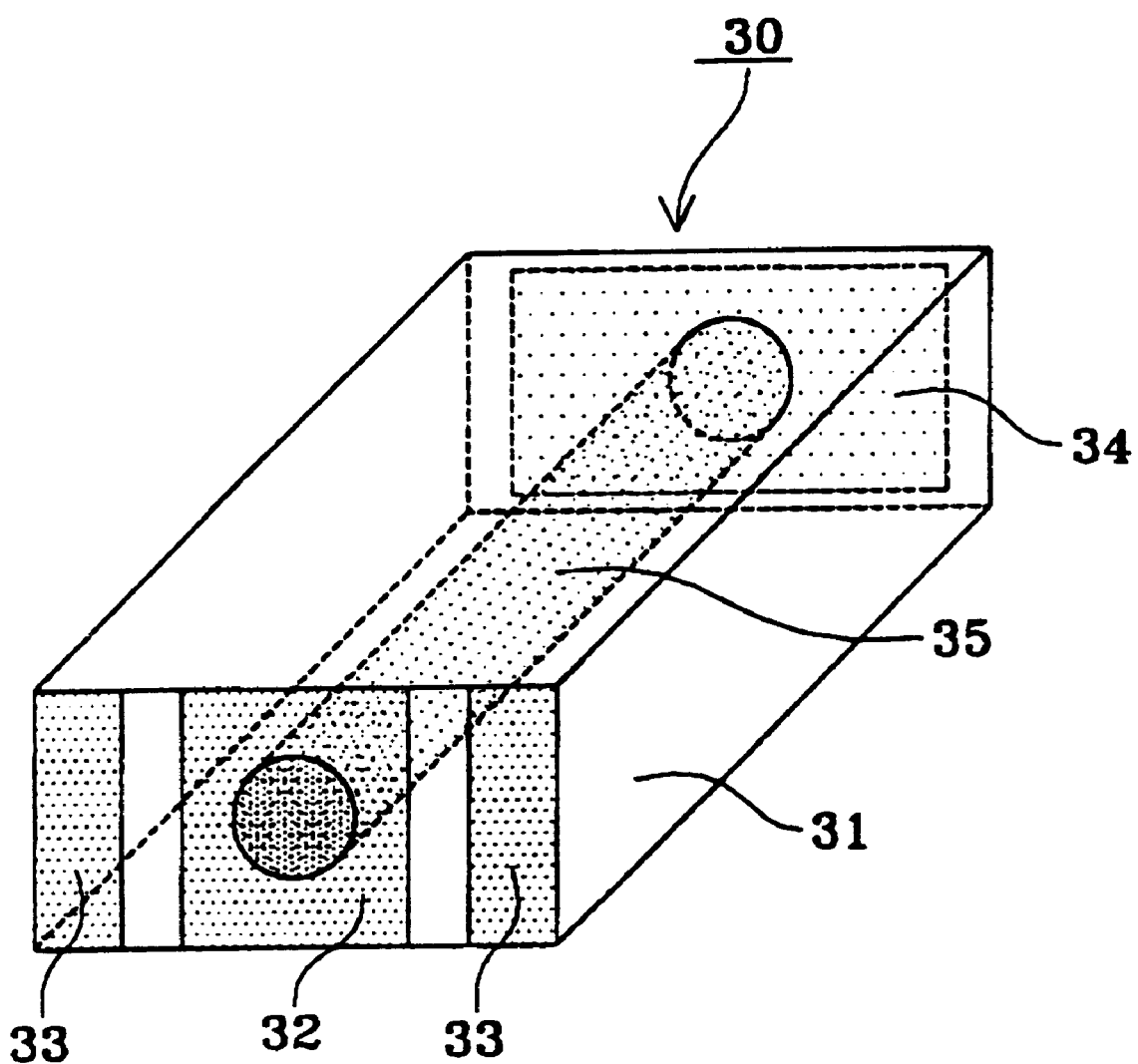
FIG. 10 is a full perspective view showing the structure of yet another surface-mount antenna used in a circular-polarization antenna according to the present invention.

FIG. 10 shows the structure of yet another surface-mount antenna used for a circular-polarization antenna according to the present invention. In FIG. 10, the surface-mount antenna 30 includes a base member 31 made from a dielectric such as resin or ceramic, a power-feeding electrode 32 and ground electrodes 33 at both sides thereof, formed on one end face of the base member 31, an emission electrode 34 formed on the opposing end face, and a through hole 35 for connecting the power-feeding electrode 32 to the emission electrode 34 between the opposing two end faces.

The surface-mount antenna 30 configured as described above operates as a monopole antenna in which one end is open due to the power-feeding electrode 32, the through hole 35, and the emission electrode 34. Since the operation of a monopole antenna is well known, the description thereof is omitted.

The surface-mount antennas shown in FIG. 9 and FIG. 10 are for linear polarization. A circular-polarization antenna formed of such antenna implements the same operations and advantages as those in the embodiment shown in FIG. 1.

In the surface-mount antennas shown in the embodiments illustrated in FIG. 2 to FIG. 9, the emission electrodes have a meander shape and a U shape with two right angles at the bottom. The electrodes may have other shapes such as a straight or L shape. The base members of the surface-mount antennas in the embodiments illustrated in FIGS. 2 to 10 are made from a dielectric. They may be made from a magnetic material.

Figure 11:
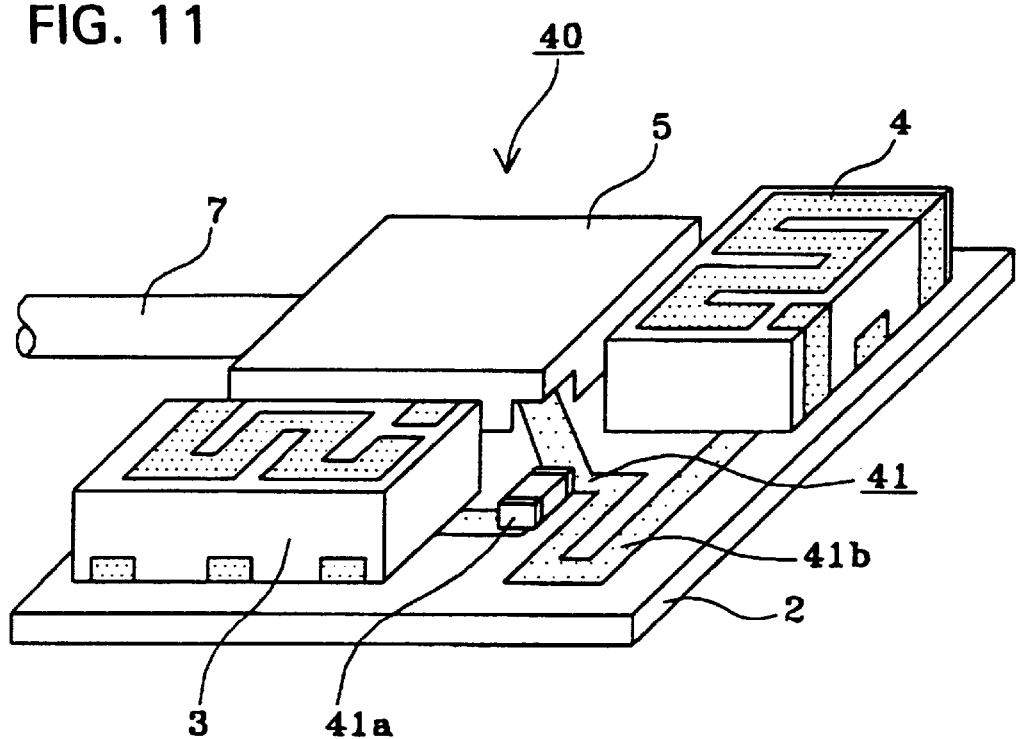
FIG. 11 is a perspective view of a circular-polarization antenna according to yet another embodiment of the present invention.

FIG. 11 shows a circular-polarization antenna according to yet another embodiment of the present invention. The same symbols as those used in FIG. 1 are assigned to the same portions or the equivalent portions in FIG. 11, and the descriptions thereof will be omitted.

In FIG. 11, a phase circuit 41 of a circular-polarization antenna 40 has a surface-mount capacitor 41*a* at a portion connected to a surface-mount antenna 3 and an inductance formed of a microstrip line 41*b* at a portion connected to a surface-mount antenna 4. The surface-mount capacitor 41*a* and the microstrip line 41*b* serve as a capacitive element showing a capacitive function and an inductive element showing an inductive function, respectively. Their capacitance, length, and width are determined such that signals applied to the surface-mount antennas 3 and 4 have a phase shift of 90 degrees and their impedances match the output impedances of the surface-mount antennas 3 and 4.

Figure 12:
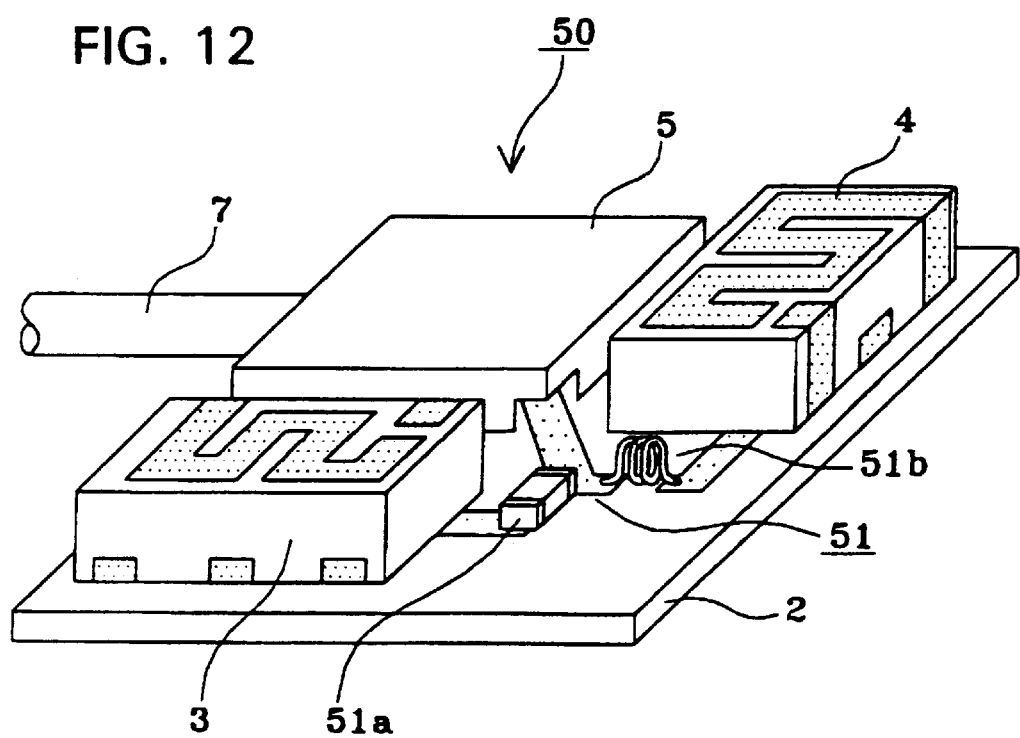
FIG. 12 is a perspective view of a circular-polarization antenna according to a further embodiment of the present invention.

FIG. 12 shows a circular-polarization antenna according to a further embodiment of the present invention. The same symbols as those used in FIG. 1 are assigned to the same portions or the equivalent portions in FIG. 12, and the descriptions thereof will be omitted.

In FIG. 12, a phase circuit 51 of a circular-polarization antenna 50 has a surface-mount capacitor 51*a* at a portion connected to a surface-mount antenna 3 and an air-core inductor 51*b* at a portion connected to a surface-mount antenna 4. The surface-mount capacitor 51*a* and the air-core inductor 51*b* serve as a capacitive element showing a capacitive function and an inductive element showing an inductive function, respectively. Their capacitance and inductance are determined such that signals applied to the surface-mount antennas 3 and 4 have a phase shift of 90 degrees and their impedances match the output impedances of the surface-mount antennas 3 and 4.

Figure 13:
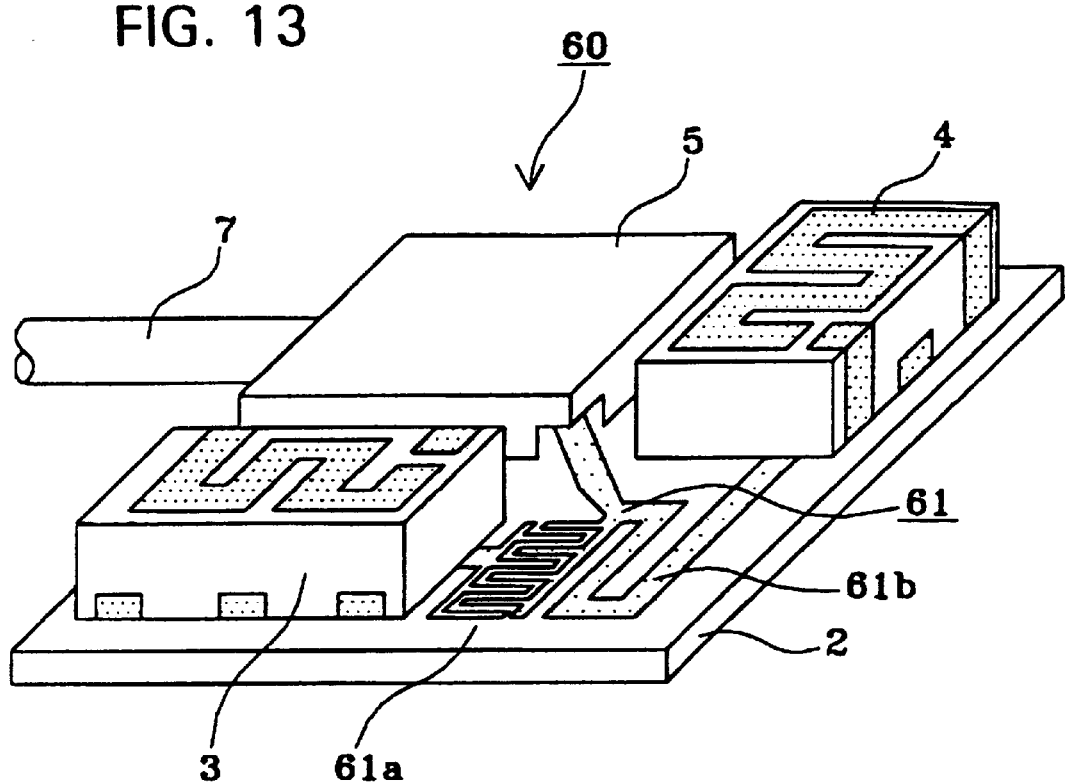
FIG. 13 is a perspective view of a circular-polarization antenna according to still a further embodiment of the present invention.

FIG. 13 shows a circular-polarization antenna according to a still further embodiment of the present invention. The same symbols as those used in FIG. 1 are assigned to the same portions or the equivalent portions in FIG. 13, and the descriptions thereof will be omitted.

In FIG. 13, a phase circuit 61 of a circular-polarization antenna 60 has an interdigital capacitor 61*a* formed on a mounting substrate 2, at a portion connected to a surface-mount antenna 3 and an inductance formed of a microstrip line 61*b* at a portion connected to a surface-mount antenna 4. The interdigital capacitor 61*a* and the microstrip line 61*b* serve as a capacitive element showing a capacitive function and an inductive element showing an inductive function, respectively. Their capacitance, length and width are determined such that signals applied to the surface-mount antennas 3 and 4 have a phase shift of 90 degrees and their impedances match the output impedances of the surface-mount antennas 3 and 4.

Figure 14:
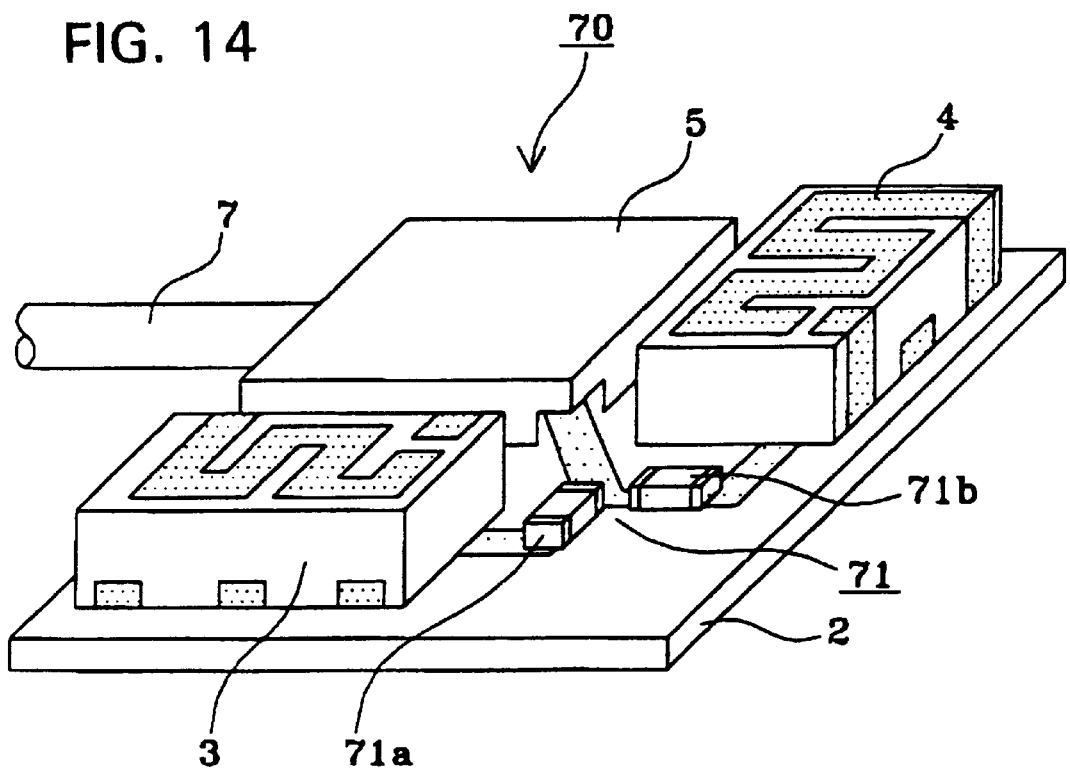
FIG. 14 is a perspective view of a circular-polarization antenna according to a yet further embodiment of the present invention.

FIG. 14 shows a circular-polarization antenna according to a yet further embodiment of the present invention. The same symbols as those used in FIG. 1 are assigned to the same portions or the equivalent portions in FIG. 14, and the descriptions thereof will be omitted.

In FIG. 14, a phase circuit 71 of a circular-polarization antenna 70 has a surface-mount capacitor 71*a* at a portion connected to a surface-mount antenna 3 and a surface-mount inductor 71*b* at a portion connected to a surface-mount antenna 4. The surface-mount capacitor 71*a* and the surface-mount inductor 71*b* serve as a capacitive element showing a capacitive function and an inductive element showing an inductive function, respectively. Their capacitance and inductance are determined such that signals applied to the surface-mount antennas 3 and 4 have a phase shift of 90 degrees and their impedances match the output impedances of the surface-mount antennas 3 and 4.

Figure 15:
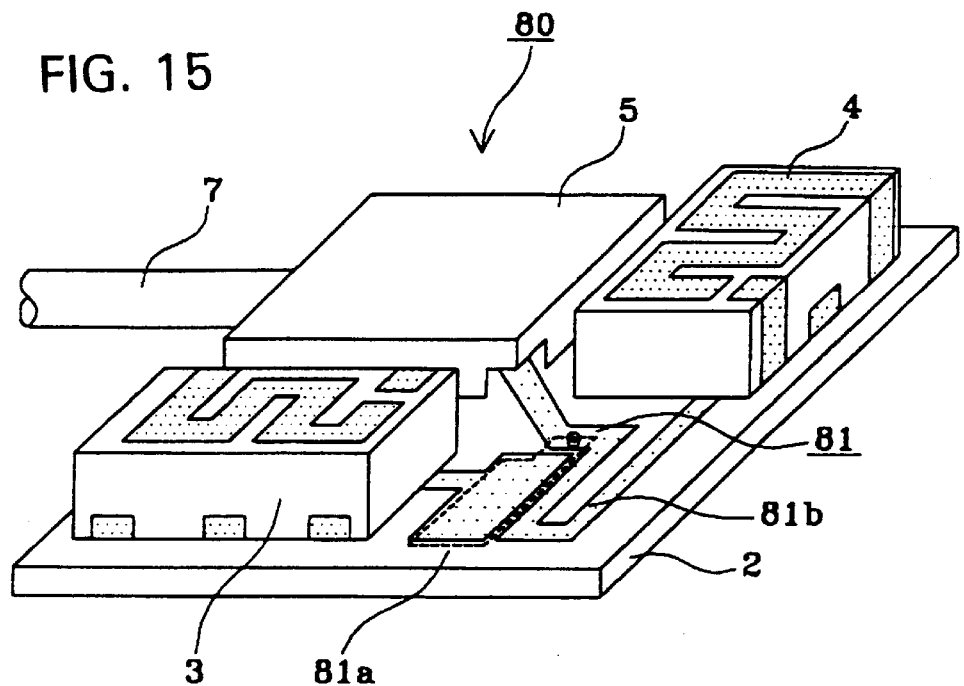
FIG. 15 is a perspective view of a circular-polarization antenna according to a yet still further embodiment of the present invention.

FIG. 15 shows a circular-polarization antenna according to a yet still further embodiment of the present invention. The same symbols as those used in FIG. 1 are assigned to the same portions or the equivalent portions in FIG. 15, and the descriptions thereof will be omitted.

In FIG. 15, a phase circuit 81 of a circular-polarization antenna 80 has a flat-plane capacitor 81*a* formed by electrodes formed at the upper side and inside of a multilayer mounting substrate 2, at a portion connected to a surface-mount antenna 3 and a microstrip line 81*b* at a portion connected to a surface-mount antenna 4. The flat-plane capacitor 81*a* and the microstrip line 81*b* serve as a capacitive element showing a capacitive function and an inductive element showing an inductive function, respectively. Their capacitance, inductance, length, and width are determined such that signals applied to the surface-mount antennas 3 and 4 have a phase shift of 90 degrees and their impedances match the output impedances of the surface-mount antennas 3 and 4.

As described above, since a capacitor and an inductor are used for the capacitive element and the inductive element of the phase circuit, the circular-polarization antennas 40, 50, 60, 70, and 80 of the present invention achieve the same operations and advantages as in the embodiment shown in FIG. 1. With the use of chip components as the capacitive element and the inductive element, the area required for forming the phase circuit can be reduced to make the circular-polarization antenna compact. In addition, because the capacitance and the inductance can be easily changed due to the use of chip components, the mounting substrate 2 can be flexibly used for circular-polarization antennas with different frequencies.

Figure 16:
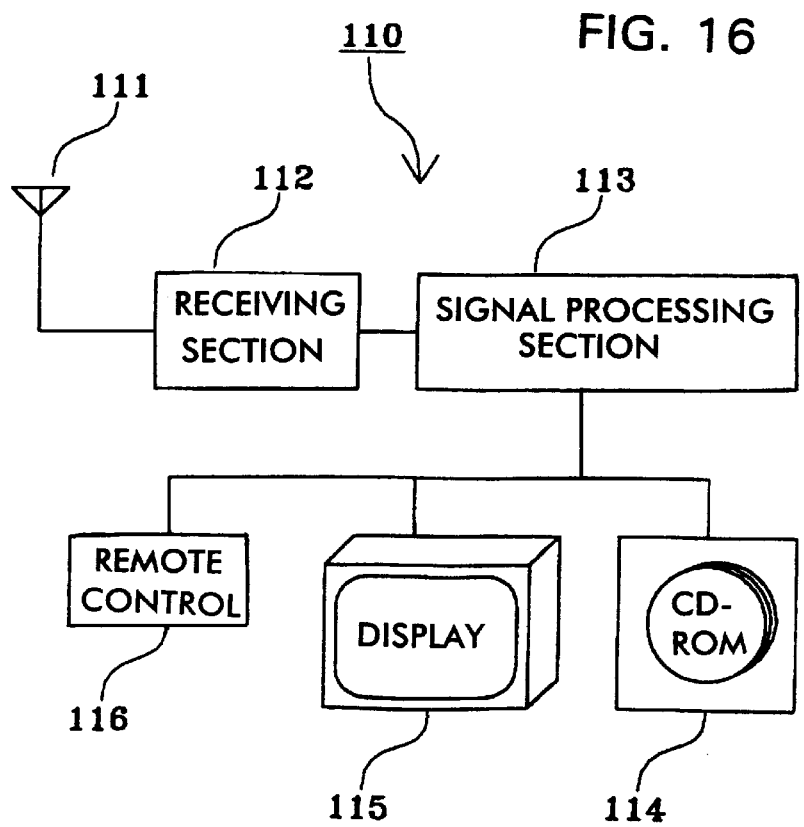
FIG. 16 is a block diagram showing an embodiment of a radio apparatus of the present invention.
Figure 17:
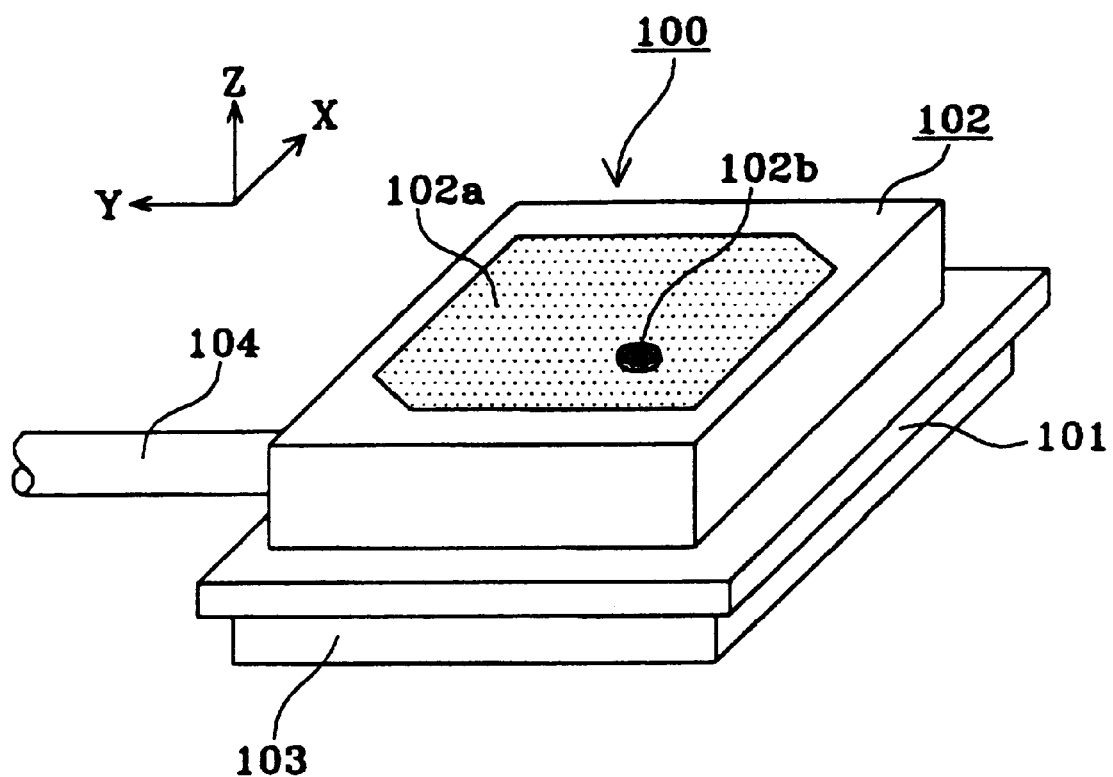
FIG. 17 is a perspective view of a conventional circular-polarization antenna.
Figure 18A:
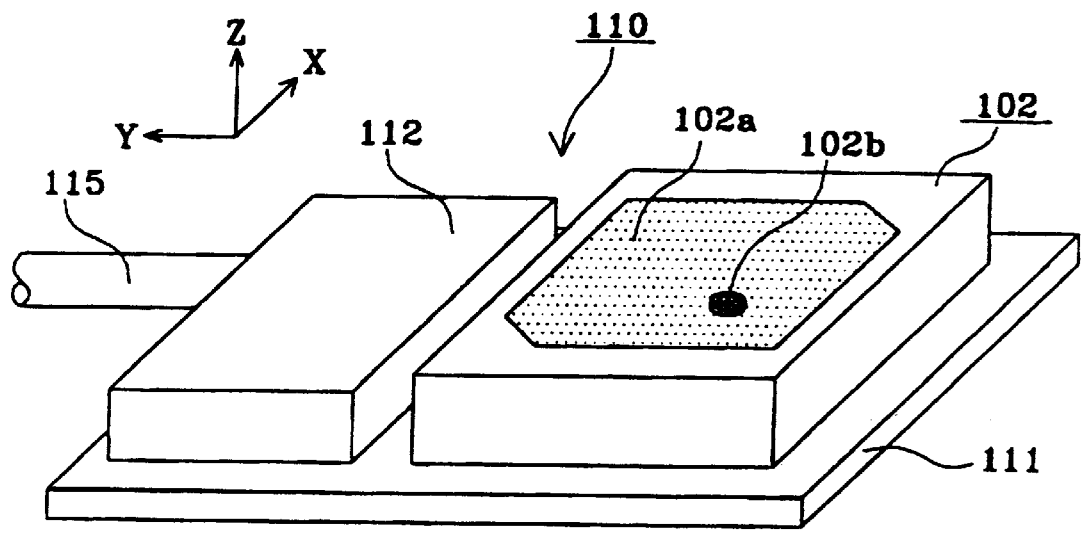
FIG. 18(*a*) and FIG. 18(*b*) are perspective views of another conventional circular-polarization antenna.
Figure 18B:
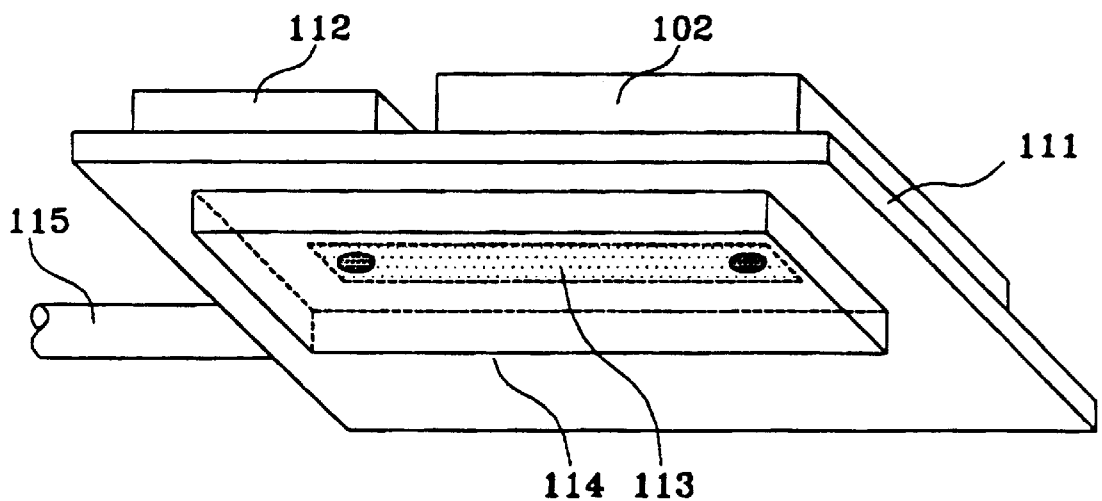

FIG. 16 shows a configuration of a navigation-system as an embodiment of a radio apparatus using the circular-polarization antenna of the present invention.

In the FIG. 16, a radio apparatus 110 comprises an antenna 111 comprising the circular-polarization antenna of the present invention housed in a case with a radome, a receiving section 112 connected to the antenna 111, a signal-processing section 113 connected to the receiving section 112, a mapping system 114, a display 115 and an interface section 116 respectively connected to the signal-processing section 113. The antenna 111 receives electric waves from a plurality of GPS satellites and various kind of signals are picked up from the electric waves in the receiving section 112. In the signal-processing section 113, the present position of the radio apparatus itself i.e., an automobile equipped with the radio apparatus, is calculated from the received signals. A map and the present position is displayed on the display 115 with a help of the interface section 116 having the mapping system 114 comprising map software in the form of CD-ROM and a remote-control etc.

By configuring the navigation system which is one of a radio apparatus using the circular-polarization antenna of the present invention as described above, miniaturization and cost reduction of the radio apparatus itself, and large-flexibility of placement by miniaturization are achieved. Thereby, a cost reduction of setting up the navigation system in an automobile can be achieved, for example.

In the radio apparatus 110, the circular-polarization antenna 1 is used. The same effect can be obtained when the circular-polarization antenna 9, 15, 40, 50, 60, 70, 80 shown in FIGS. 6, 8, and 11–15.

While the invention has been particularly shown and described with reference to preferred embodiments thereof, it will be understood by those skilled man in the art that the forgoing and other changes in form and details may be made therein without departing from the spirit of the invention.

What is claimed is:

1. A circular-polarization antenna, comprising:

a mounting substrate;

a pair of linear-polarization surface-mount antennas mounted on said mounting substrate each having a plane of polarization, the surface-mount antennas disposed such that the respective planes of polarization in a direction normal to the mounting surface of said mounting substrate are substantially perpendicular to each other;

a phase circuit connected to said pair of linear-polarization surface-mount antennas for at least one of sending thereto and receiving therefrom signals having the same amplitude and a phase difference of 90 degrees to each other;

an amplification circuit connected to said phase circuit;

a shield case covering said amplification circuit; and said pair of linear-polarization surface-mount antennas, said phase circuit, said amplification circuit and said shield case being mounted on the same mounting surface of said mounting substrate, said phase circuit comprising a first microstrip line having a first end and a second end, the first end being divided into a pair of second and third microstrip lines, which are connected to a pair of surface-mount antennas respectively, and the second end being connected to the amplification circuit.

2. The circular-polarization antenna of claim 1, further comprising a radome covering said surface-mount antennas, said phase circuit, said shield case and said mounting substrate.

3. The circular-polarization antenna of claim 1 wherein each of the surface-mount antennas has at least a power-feeding electrode, an emission electrode and a ground electrode provided on at least one of a surface of and inside of a substantially parallelopiped-rectangular base member made of at least one of a dielectric material and a magnetic material.

4. The circular-polarization antenna of claim 2 wherein each of the surface-mount antennas has at least a power-feeding electrode, an emission electrode and a ground electrode provided on at least one of a surface of and inside of a substantially parallelopiped-rectangular base member made of at least one of a dielectric material and a magnetic material.

5. The circular-polarization antenna of claim 3, wherein each of said surface-mount antennas is formed such that said ground electrode is provided substantially on a first major surface of said base member, said emission electrode is formed substantially on a second major surface of the base member with one end serving as an open end and the other end serving as a ground end connected to said ground electrode, and one end of said power-feeding electrode is formed in the vicinity of the open end of said emission electrode.

6. The circular-polarization antenna of claim 4, wherein each of said surface-mount antennas is formed such that said ground electrode is provided substantially on a first major surface of said base member, said emission electrode is formed substantially on a second major surface of the base member with one end serving as an open end and the other end serving as a ground end connected to said ground electrode, and one end of said power-feeding electrode is formed in the vicinity of the open end of said emission electrode.

7. The circular-polarization antenna of claim 5, wherein the other end of said emission electrode of each of the surface-mount antennas is divided into a plurality of ends, and the ends are connected to the ground electrode through different end faces of said base member and serve as ground ends.

8. The circular-polarization antenna of claim 5, wherein said pair of surface-mount antennas are disposed such that the respective ground ends thereof are farthest away from each other.

9. The circular-polarization antenna of claim 7, wherein said pair of surface-mount antennas are disposed such that the respective ground ends thereof are farthest away from each other.

10. The circular-polarization antenna of claim 5, wherein the open end of said emission electrode in each of said surface-mount antennas is formed inward from an end of the second major surface of said base member at a predetermined distance on the second major surface of the base member.

11. The circular-polarization antenna of claim 7, wherein the open end of said emission electrode in each of said surface-mount antennas is formed inward from an end of the second major surface of said base member at a predetermined distance on the second major surface of the base member.

12. The circular-polarization antenna of claim 8, wherein the open end of said emission electrode in each of said surface-mount antennas is formed inward from an end of the second major surface of said base member at a predetermined distance on the second major surface of the base member.

13. The circular-polarization antenna of claim 1, further comprising a shield plate provided between said pair of surface-mount antennas.

14. The circular-polarization antenna of claim 1, wherein said phase circuit comprises at least one of a capacitive element and an inductive element connected to said pair of surface-mount antennas.

15. A radio apparatus, comprising:
   a circular-polarization antenna, comprising:
   a mounting substrate;
   a pair of linear-polarization surface-mount antennas mounted on said mounting substrate each having a plane of polarization, the surface-mount antennas disposed such that the respective planes of polarization in a direction normal to the mounting surface of said mounting substrate are substantially perpendicular to each other;
   a phase circuit connected to said pair of linear-polarization surface-mount antennas for at least one of sending thereto and receiving therefrom signals having the same amplitude and a phase difference of 90 degrees to each other;
   an amplification circuit connected to said phase circuit;
   a shield case covering said amplification circuit;
   said pair of linear-polarization surface-mount antennas, said phase circuit, said amplification circuit and said shield case being mounted on the same mounting surface of said mounting substrate; and
   a receiving section and a signal-processing section connected in series to said circular-polarization antenna, said phase circuit comprising a first microstrip line having a first end and a second end, the first end being divided into a pair of second and third microstrip lines, which are connected to a pair of surface-mount antennas respectively, and the second end being connected to the amplification circuit.

16. The radio apparatus of claim 15, further comprising a radome covering said surface-mount antennas, said phase circuit, said shield case and said mounting substrate.

17. The radio apparatus of claim 15, further wherein each of the surface-mount antennas has at least a power-feeding electrode, an emission electrode and a ground electrode provided on at least one of a surface of and inside of a substantially parallelopiped-rectangular base member made of at least one of a dielectric material and a magnetic material.

18. The radio apparatus of claim 17, further wherein each of said surface-mount antennas is formed such that said ground electrode is provided substantially on a first major surface of said base member, said emission electrode is formed substantially on a second major surface of the base member with one end serving as an open end and the other end serving as a ground end connected to said ground electrode, and one end of said power-feeding electrode is formed in the vicinity of the open end of said emission electrode.

19. The radio apparatus of claim 18, further wherein the other end of said emission electrode of each of the surface-mount antennas is divided into a plurality of ends, and the ends are connected to the ground electrode through different end faces of said base member and serve as ground ends.

20. The radio apparatus of claim 18, further wherein said pair of surface-mount antennas are disposed such that the respective ground ends thereof are farthest away from each other.

21. The radio apparatus of claim 18, further wherein the open end of said emission electrode in each of said surface-mount antennas is formed inward from an end of the second major surface of said base member at a predetermined distance on the second major surface of the base member.

22. The radio apparatus of claim 15, further comprising a shield plate provided between said pair of surface-mount antennas.

23. The radio apparatus of claim 15, further wherein said phase circuit comprises at least one of a capacitive element and an inductive element connected to said pair of surface-mount antennas.

24. A method of at least one of transmitting and receiving radio signals, comprising:
   providing a circular-polarization antenna, the antenna comprising:
   a mounting substrate;
   a pair of linear-polarization surface-mount antennas mounted on said mounting substrate each having a plane of polarization, the surface-mount antennas disposed such that the respective planes of polarization in the direction normal to the mounting surface of said mounting substrate are substantially perpendicular to each other;
   a phase circuit connected to said pair of linear-polarization surface-mount antennas for at least one of sending thereto and receiving therefrom signals having the same amplitude and a phase difference of 90 degrees to each other;
   an amplification circuit connected to said phase circuit;
   a shield case covering said amplification circuit; and
   said pair of linear-polarization surface-mount antennas, said phase circuit, said amplification circuit and said shield case being mounted on the same mounting surface of said mounting substrate;
   said phase circuit comprising a first microstrip line having a first end and a second end, the first end being divided into a pair of second and third microstrip lines, which are connected to a pair of surface-mount antennas respectively, and the second end being connected to the amplification circuit;
   connecting the circular polarization antenna to a radio apparatus; and
   at least one of:
   receiving radio signals with the antenna and providing them to the radio apparatus; and
   transmitting radio signals from the antenna provided to the antenna from the radio apparatus.

25. The method of claim 24, further comprising providing a radome covering said surface-mount antennas, said phase circuit, said shield case and said mounting substrate.

26. The method of claim 24, further comprising providing each of the surface-mount antennas with at least a power-feeding electrode, an emission electrode, and a ground electrode on at least one of a surface of and inside of a substantially parallelopiped-rectangular base member made of at least one of a dielectric material and a magnetic material.

27. The method of claim 26, further comprising forming each of said surface-mount antennas such that said ground electrode is provided substantially on a first major surface of said base member, forming said emission electrode substantially on a second major surface of the base member with one end serving as an open end and the other end serving as a ground end connected to said ground electrode, and providing one end of said power-feeding electrode in the vicinity of the open end of said emission electrode.

28. The method of claim 27, further comprising providing the other end of said emission electrode of each of the surface-mount antennas so that it is divided into a plurality of ends, and connecting the ends to the ground electrode through different end faces of said base member to serve as ground ends.

29. The method of claim 27, further comprising disposing said pair of surface-mount antennas such that the respective ground ends thereof are farthest away from each other.

30. The method of claim 27, further comprising forming the open end of said emission electrode in each of said surface-mount antennas inward from an end of the second major surface of said base member at a predetermined distance on the second major surface of the base member.

31. The method of claim 24 further comprising providing a shield plate between said pair of surface-mount antennas.

32. The method of claim 24, further comprising forming said phase circuit with at least one of a capacitive element and an inductive element connected to said pair of surface-mount antennas.

* * * * *